United States Patent
Luo et al.

(10) Patent No.: US 10,304,931 B2
(45) Date of Patent: May 28, 2019

(54) POLARIZATION-DOPED ENHANCEMENT MODE HEMT

(71) Applicant: University of Electronic Science and Technology of China, Chengdu (CN)

(72) Inventors: Xiaorong Luo, Chengdu (CN); Fu Peng, Chengdu (CN); Chao Yang, Chengdu (CN); Jie Wei, Chengdu (CN); Siyu Deng, Chengdu (CN); Dongfa Ouyang, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 226 days.

(21) Appl. No.: 15/623,371

(22) Filed: Jun. 14, 2017

(65) Prior Publication Data

US 2018/0294335 A1    Oct. 11, 2018

(30) Foreign Application Priority Data

Apr. 7, 2017   (CN) .......................... 2017 1 0222890

(51) Int. Cl.
| | |
|---|---|
| *H01L 29/06* | (2006.01) |
| *H01L 29/15* | (2006.01) |
| *H01L 29/207* | (2006.01) |
| *H01L 29/423* | (2006.01) |
| *H01L 29/78* | (2006.01) |

(Continued)

(52) U.S. Cl.
CPC ........ *H01L 29/158* (2013.01); *H01L 29/0615* (2013.01); *H01L 29/1054* (2013.01); *H01L 29/157* (2013.01); *H01L 29/207* (2013.01); *H01L 29/4236* (2013.01);

(Continued)

(58) Field of Classification Search
None
See application file for complete search history.

(56) References Cited

U.S. PATENT DOCUMENTS

| | | | |
|---|---|---|---|
| 2012/0069863 A1* | 3/2012 | Sizov ..................... | B82Y 20/00 372/45.012 |
| 2013/0088280 A1* | 4/2013 | Lal .......................... | H01L 25/00 327/513 |

OTHER PUBLICATIONS

J. Li, et.al. "High breakdown voltage GaN HFET with field plate" IEEE Electron Lett., vol. 37, No. 3, pp. 196-197, Feb. 2001.

(Continued)

*Primary Examiner* — Calvin Y Choi
(74) *Attorney, Agent, or Firm* — Gokalp Bayramoglu

(57) ABSTRACT

The present invention belongs to the field of semiconductor technology and relates to a polarization-doped enhancement mode HEMT device. The technical solution of the present invention grows the first barrier layer and the second barrier layer that contain gradient Al composition sequentially on the buffer layer. The gradient trends of the two layers are opposite. The three-dimensional electron gas (3DEG) and the three-dimensional hole gas (3DHG) are induced and generated in the barrier layers due to the inner polarization difference respectively. A trench insulated gate structure is at one side of the source which is away from the metal drain and is in contact with the source. First, since the highly concentrated electrons exist in the entire first barrier layer, the on-state current is improved greatly. Second, the vertical conductive channel between the source and the 3DEG are pinched off by the 3DHG, so as to realize the enhancement mode.

11 Claims, 3 Drawing Sheets

(51) Int. Cl.
*H01L 29/10* (2006.01)
*H01L 29/20* (2006.01)
*H01L 29/778* (2006.01)

(52) U.S. Cl.
CPC ...... *H01L 29/7827* (2013.01); *H01L 29/2003* (2013.01); *H01L 29/7788* (2013.01)

(56) References Cited

OTHER PUBLICATIONS

Akira Nakajima, et.al. "GaN-Based Super Heterojunction Field Effect Transistors Using the Polarization Junction Concept" IEEE Electron Device Letters, vol. 32, No. 4, pp. 542-544, 2011.
W. Saito, et.al., "Recessed-gate structure approach toward normally off high-voltage AlGaN/GaN HEMT for power electronics applications," IEEE Trans. Electron Devices, vol. 53, No. 2, pp. 356-362, Feb. 2006.

* cited by examiner

POLARIZATION-DOPED ENHANCEMENT MODE HEMT

CROSS REFERENCE

This application claims priority to Chinese Patent Application No. 201710222890.4, filed on Apr. 7, 2017 the entire contents of which are incorporated herein by reference.

FIELD OF THE INVENTION

The present invention relates to the field of semiconductor technology and more particularly relates to a polarization-doped enhancement mode HEMT.

BACKGROUND OF THE INVENTION

GaN-based high electron mobility transistors (HEMTs) have a great prospect in the field of large-current, low-power-consumption, high-frequency and high-voltage switching applications due to high electron saturation speed, high two-dimensional electron gas (2DEG) density and high critical breakdown electric field.

The key of power switching devices is to achieve high breakdown voltage, low power consumption, and high reliability. The critical breakdown electric field of GaN material is ten times that of Si. The breakdown voltage of GaN power device is far lower than its theoretical limit at present. One of the important reasons is that the electric field crowding at the gate leads to premature breakdown. At this time, the drift region is not completely depleted.

The field plate technology is a common terminal technology to improve the breakdown voltage of the device. A Reference (J. Li, et.al. "High breakdown voltage GaN HFET with field plate" IEEE Electron Lett., Vol. 37, no. 3, pp. 196-197, February 2001.) discloses a field plate which is shortly connected to the gate. As shown in FIG. 1. The introduction of field plate can reduce the curvature effect of the main junction and electric field peaks, thereby increase the breakdown voltage. However, the introduction of the field plate increases the parasitic capacitance of the device, which adversely affects the high frequency and switching properties of the device. Reference (Akira Nakajima., et.al. "GaN-Based Super Heterojunction Field Effect Transistors Using the Polarization Junction Concept" IEEE Electron Device Letters, vol. 32, no. 4, pp. 542-544,2011) uses the concept of polarization super junction. A top layer of GaN is gown on the AlGaN barrier layer of the drift region, and two-dimensional hole gas (2DHG) is formed at the interface thereof 2DHG and the underlying 2DEG form a natural "super junction" to assist the depletion of the drift region when blocking the breakdown voltage of the device, so as to optimize the horizontal electrical field, and thus the purpose of improving the breakdown voltage is achieved, as shown in FIG. 2. However, the top layer of GaN and the gate form Ohm contact of holes. Thus, when the device is forward conductive, if the gate voltage is large, leaking current will occur at the gate, which limits the gate voltage swing.

For AlGaN/GaN devices, it is well-known that enhancement mode HEMT devices have more advantages than depletion mode HEMTs. Therefore, researchers have a great interest in how to realize the enhancement mode. Reference (W. Saito, et.al., "Recessed-gate structure approach toward normally off high-voltage AlGaN/GaN HEMT for power electronics applications," IEEE Trans. Electron Devices, vol. 53, no. 2, pp. 356-362, February 2006) adopts the trench gate structure to achieve a quasi-enhancement mode AlGaN/GaN HEMT, as shown in FIG. 3. Recessed gate etching can effectively deplete the 2DEG concentration under the gate, so the threshold voltage is greatly increased. However, recessed gate etching requires precise control of the etch depth and also may cause etch damage. Common ways to achieve the enhancement mode also include fluoride ions treatment in barrier layer under the gate. P-type GaN gate, etc. These methods all realize the enhancement anode by depleting 2DEG under the gate, which will inevitably lead to the contradiction between high threshold voltage and large saturation output current.

SUMMARY OF THE INVENTION

In view of the above problems, a polarization-eloped enhancement mode HEMT device is provided.

With reference to FIG. 4, technical solutions of the present invention are as below.

A polarization-doped enhancement mode HEMT comprises a substrate layer, a buffer layer, a barrier layer, a cap layer, that are arranged in an order from bottom to top. The barrier layer includes a first barrier layer and a second barrier layer that are in contact with each other. The second barrier layer is on the upper surface of the first barrier layer. The percentage of Al composition in the first barrier layer increases progressively from 0 linear or non-linear at a lower surface to x at an upper surface. The percentage of Al composition of the second barrier layer decreases progressively from x at a lower surface to 0 linear or non-linear at an upper surface; wherein $0<x\le1$. A metal drain which forms an ohmic contact is disposed at the upper surface of the first barrier layer. A hole blocking region is disposed between the second barrier layer, the cap layer, and the metal drain electrode. A metal source is disposed at the upper surface of the cap layer. A trench insulated gate structure is formed at one side of the metal source which is away from the metal drain. The trench insulated gate structure includes an insulated gate dielectric in the wall of the trench and a metal gate inside the insulated gate dielectric. The insulated gate dielectric is in contact with the buffer layer, the barrier layer, the cap layer, and the metal source.

Further, the hole blocking region is achieved by etching to remove a part of the second barrier layer and a part of the cap layer.

Further, the hole blocking region is achieved by ion implantation. Also, a part of a region of the cap layer which is located between the source and the drain is in contact with the hole blocking region and is P-type doped.

Further, the region of the cap layer and the second barrier layer beneath the source is N-type doped.

Further, the dielectric passivation layer is disposed on the upper surfaces of the cap layer.

Further, the material used for the barrier layer is $Al_xGa_{1-x}N$, wherein $0\le x\le 1$.

Further, the material used for the insulated dielectric is one of or a combination of $Al_2O_3$, $HfO_2$, $SiO_2$.

Further, the material used for the buffer layer and the cap layer is one of or a combination of GaN, AlN, AlGaN, InGaN, and InAlN.

Further, the material used for the substrate layer is one of or a combination of sapphire, Si, SiC, AlN, GaN, and AlGaN.

The beneficial effects of the present invention are as follows:

1. The invention sequentially grows the first barrier layer and the second barrier layer that contain gradient Al composition on the buffer layer such that highly concentrated 3DEG occurs in the whole first barrier layer. On-state current of the device is greatly improved.

2. The present invention pinches off the vertical conductive channel between the source and the 3DEG by the 3DHG, thereby the enhancement mode is realized. Moreover, the conductive channel can be controlled by applying voltage on the trenched gate. The threshold voltage can be adjusted by doping part of the conductive channel.

3. In the present invention, 3DEG-3DHG forms the polarization super junction, which assists the depletion of the drift region in a blocking state. The horizontal electrical field is optimized. The breakdown voltage of the device is improved.

4. The device preparation process disclosed by the present invention is compatible with the conventional process.

DETAILED DESCRIPTION OF THE INVENTION

Hereinafter, with reference to the drawings and embodiments, the technical solutions of the present invention are described in detail.

Embodiment 1

Figure 1:
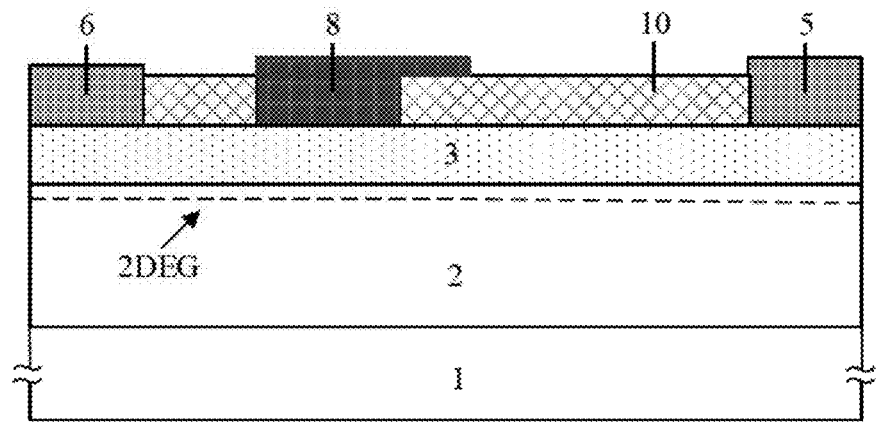
FIG. 1 shows the HEMT device structure with a gate field plate.
Figure 2:
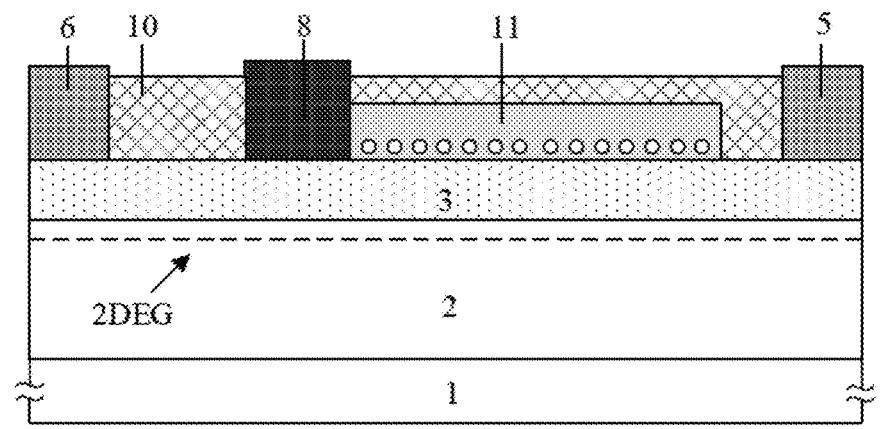
FIG. 2 shows the polarized super junction HEMT device structure with electrically connected to a gate.
Figure 3:
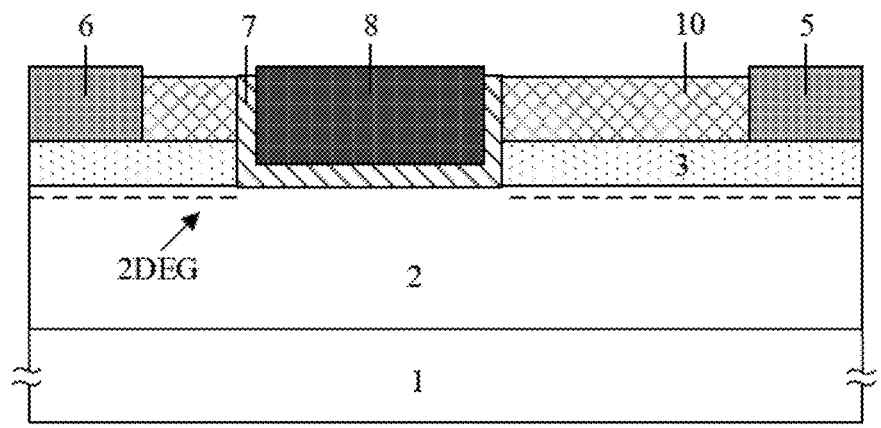
FIG. 3 shows HEMT device structure with a trench insulated gate structure.
Figure 4:
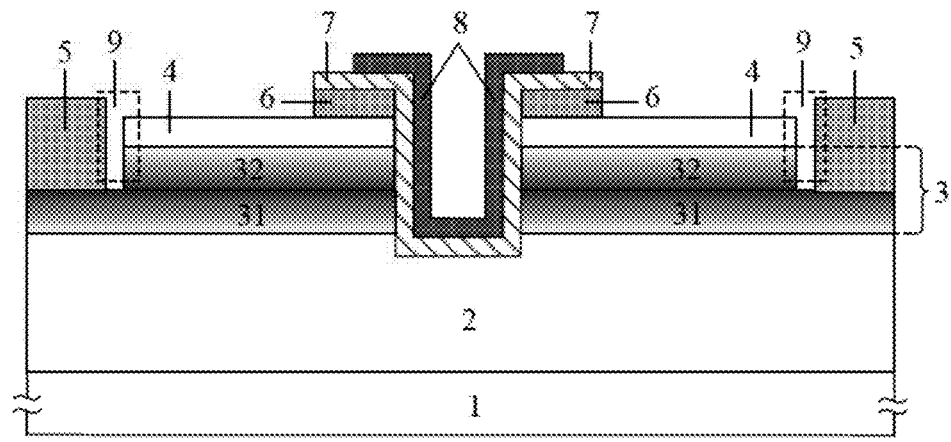
FIG. 4 shows the structure of a polarization-doped enhancement mode HEMT device in which the hole blocking region is formed by the trench etching manner proposed by the present invention.

FIG. 4 shows a polarization-doped enhancement mode HEMT device. The device of the present embodiment comprises:

substrate layer 1, buffer layer 2, barrier layer 3 and cap layer 4 arranged in an order from bottom to top. The present invention is characterized in that the barrier layer 3 comprises first barrier layer 31 and second barrier layer 32 arranged in an order from bottom to top. The Al composition of the first barrier layer 31 increases progressively from linear or non-linear at the lower surface of x at the upper surface ($0<x\leq1$). The Al composition of the second barrier layer 32 decreases progressively from x ($0<x\leq1$) linear of non-linear at the lower surface to 0 at the upper surface. Metal drain 5 which forums Ohmic contact is disposed at the upper surface of the first barrier layer 31. Hole blocking region 9 is disposed between second barrier layer 32, cap layer 4, and metal drain 5. The hole blocking region 9 are formed near the drain end by etching. Metal source 6 is disposed on the upper surface of cap layer 4. A trench insulated gate structure is formed at the side of the metal source 6 that is away from metal drain 5. The trench insulated gate structure consists of insulated gate dielectric 7 in the walls of the trench and inner metal gate 8. Insulated gate dielectric 7 is in contact with buffer layer 2, barrier layer 3, cap layer 4 and metal source 6.

The invention sequentially grows the first barrier layer and the second barrier layer that contain gradient Al composition on the buffer layer. The three-dimensional electron gas (3DEG) and the three-dimensional hole gas (3DHG) are induced and generated in the two barrier layers due to the inner polarization difference respectively. First, the on-state current of the device is greatly improved due to the highly concentrated electrons in the entire first barrier layer. Second, the vertical conductive channel between the source and the 3DEG are pinched off by the 3DHG, so as to realize the enhancement mode. The conductive channel can be controlled by applying voltage on the trenched gate. The threshold voltage can be adjusted by doping part of the conductive channel. Third, the polarization super junction is formed by the 3DEG-3DHG, which assists the depletion of the drift region in a blocking state. The horizontal electrical field is optimized. The breakdown voltage of the device is improved.

Embodiment 2

Figure 5:
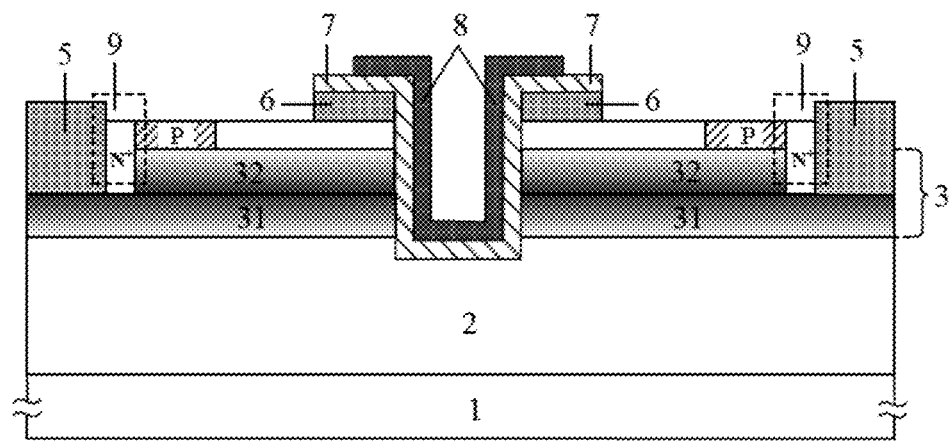
FIG. 5 shows the structure of a polarization-doped enhancement mode HEMT device in which the hole blocking region is formed by the ion implantation manner proposed by the present invention.

Compared with Embodiment 1, the device of this Embodiment adopts highly concentrated N-type ion implantation to realize hole blocking region 9 between cap layer 4 and drain 5, so that the hole conductive channel is avoided between the source and the drain. In addition, P-type doping region is formed in part of cap layer 4 which is in contact with hole blocking region 9, so as to avoid the electron leaking path from the source to the drain. Other structures are the same as those of Embodiment 1, as shown in FIG. 5. The ion implantation isolation is easier to realize and has smaller damage on materials. At the same time, NP junction formed between the drain and the source also functions to resist the withstand voltage in the off-state.

Embodiment 3

Figure 6:
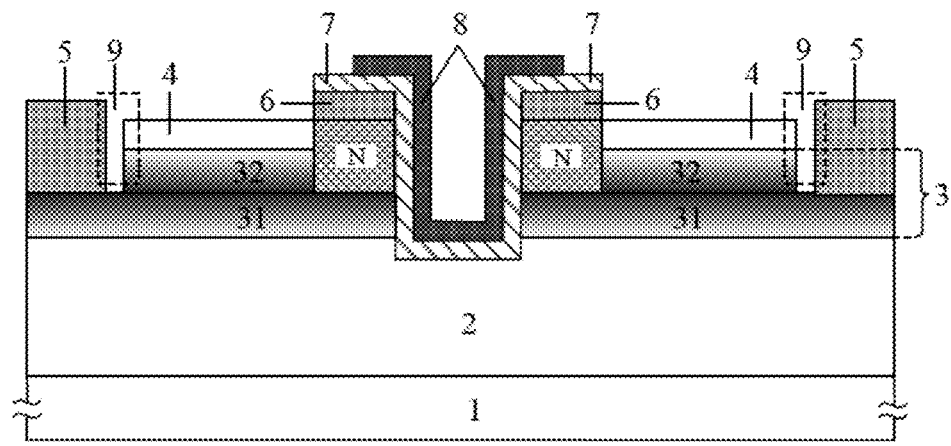
FIG. 6 shows the structure of N-doped polarization-doped enhancement mode HEMT device in which the cap layer and the second barrier layer are positioned under the source proposed by the present invention.

Compared with Embodiment 1 the device of this Embodiment adopts N-type doping in cap layer 4 and the region of second barrier layer 32 beneath the source. Other structures are the same as those of Embodiment 1, as shown in FIG. 6. On one hand, the N-type doped part beneath the source can make the source metal form a better Ohmic contact with the cap layer. On the other hand, the N-type doping modulates the concentration of the 3DHG, so as to control the threshold voltage.

Embodiment 4

Figure 7:
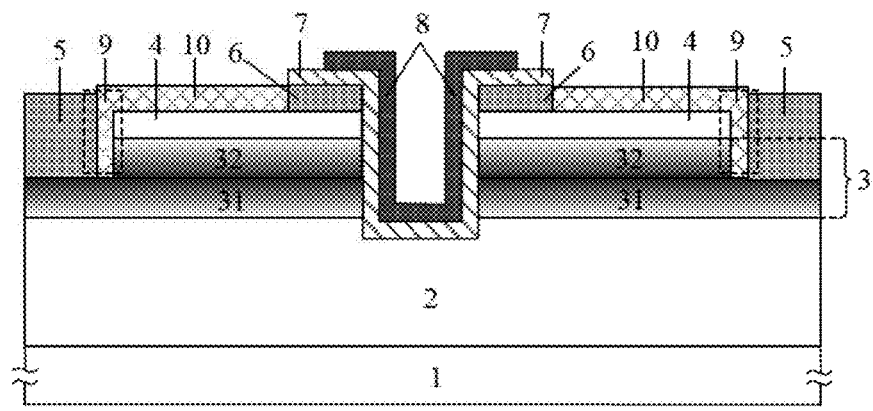
FIG. 7 shows the structure of a polarization-doped enhancement mode HEMT device which has a dielectric passivation layer.

Compared with Embodiment 1, in the device of this Embodiment, dielectric passivation layer 10 is formed on the upper surfaces of cap layer 4 between the source and the drain. Other structures are the same as those of Embodiment 1, as shown in FIG. 7. A surface state of the device can be improved by using the dielectric passivation layer, and the current collapse is inhibited.

In the polarization-doped enhancement mode, HEMTs described in the above embodiments, the material of the substrate layer 1 can be one of or a combination of sapphire, Si, SiC, AlN, GaN, AlGaN. The material of the buffer layer 2 and cap layer 4 can be one of or a combination of GaN, AlN, AlGaN, InGaN, InAlN. The material of the barrier layer can be gradient $Al_xGa_{1-x}N$ ($0 \leq x \leq 1$). For passivation layer 10, the common material is SiNx, while other dielectric materials, such as $Al_2O_3$, AlN can be used. The insulated gate dielectric 7 can use the same material as that of the passivation layer. The source 6 and the drain 5 usually use metal alloys, such as Ti/Al/Ni/Au or Mo/Al/Mo/Au and so on. The gate 8 usually uses metal alloys with relatively large work function, such as Ni/Au car Ti/Au and so on.

Figure 8:
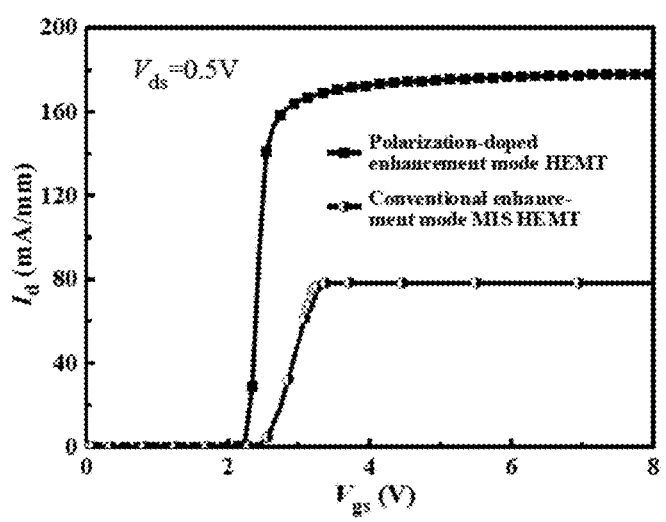
FIG. 8 is a comparison chart of the transfer characteristic curves of the polarization-doped enhancement mode HEMT device structure proposed by the present invention and the conventional enhancement mode MIS HEMT device structure.
Figure 9:
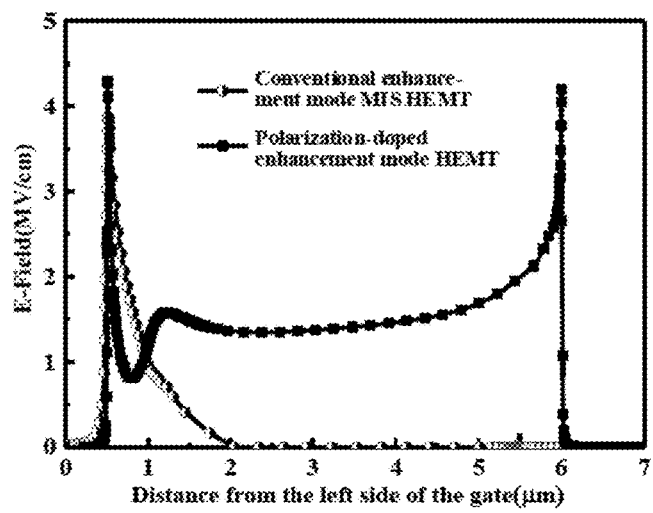
FIG. 9 is a comparison chart of the electric field distribution under the reverse withstand voltage of the polarization-doped enhancement mode HEMT device structure and the conventional enhancement mode MIS HEMT device structure.

FIGS. 8-9 respectively are the comparison charts of the transfer characteristic curves and the electric field distribution under reverse withstand voltage of the polarization-doped enhancement mode HEMT structure proposed by the present invention and the conventional enhancement mode MIS HEMT structure. Software Sentaurus TCAD is used for simulation. When the gate-drain distance is 5 μm, the saturated output current of the proposed structure of the present invention is increased from 78 mA/mm of the conventional enhancement mode MIS HEMT to 179 mA/mm. The saturation output current is increased by 129%. The breakdown voltage is increased from 177 V to 858 V.

What is claimed is:

1. A polarization-doped enhancement mode HEMT device, comprising:
    a substrate layer, a buffer layer, a barrier layer and a cap layer that are arranged in order from bottom to top; wherein the substrate layer is on the bottom, followed by the butler layer above the substrate layer, the barrier layer above the butler layer, and a cap layer above the harrier layer;
    wherein
    the barrier layer comprises a first barrier layer and a second barrier layer that are in contact with each other;
    the second barrier layer is on the upper surface of the first barrier layer;
    a percentage of an Al composition in the first barrier layer increases progressively from 0 at a lower surface to x at an upper surface;
    a percentage of an Al composition of the second barrier layer decreases progressively from x at a lower surface to 0 linear or non-linear at an upper surface;
    wherein $0 \leq x \leq 1$;
    a metal drain which forms an ohmic contact is disposed at the upper surface of the first barrier layer;
    a hole blocking region is disposed between the second barrier layer, the cap layer, and the metal drain electrode;
    a metal source is disposed at the upper surface of cap layer;
    a trench insulated gate structure is formed at one side of the metal source which is away from the metal drain;
    the trench insulated gate structure includes an insulated gate dielectric in the wall of the trench and a metal gate inside the insulated gate dielectric; and
    the insulated gate dielectric is in contact with the buffer layer, the barrier layer, the cap layer, and the metal source.

2. The polarization-doped enhancement mode HEMT device of claim 1, wherein the hole blocking region is, achieved by etching to remove a part of the second barrier layer and a part of the cap layer.

3. The polarization-doped enhancement mode HEMT device of claim 1, wherein
    the hole blocking region is achieved by ion implantation; and
    a part of a region of the cap layer which is located between the source and the drain is in contact with the hole blocking region and is P-type doped.

4. The polarization-doped enhancement mode HEMT device of claim 1, wherein a region of the cap layer and the second barrier layer beneath the source is N-type doped.

5. The polarization-doped enhancement mode HEMT device of claim 4, wherein a dielectric passivation layer is disposed on the upper surfaces of the cap layer.

6. The polarization-doped enhancement mode HEMT device of claim 5, wherein material used for the barrier layer is $Al_xGa_{1-x}N$, and wherein $0<x<1$.

7. The polarization-doped enhancement mode HEMT device of claim 6, wherein material used for the insulated dielectric is one of or a combination of $Al_2O_3$, $HfO_2$, and $SiO_2$.

8. The polarization-doped enhancement mode HEMT device of claim 7, wherein material used for the buffer layer and the cap layer is one of or a combination of GaN, AlN, AlGaN, InGaN, and InAlN.

9. The polarization-doped enhancement mode HEMT device of claim 8, wherein material used for the substrate layer is one of or a combination of sapphire, Si, SiC, AlN, GaN, and AlGaN.

10. The polarization-doped enhancement mode HEMT device of claim 2, wherein a region of the cap layer and the second barrier layer beneath the source is N-type doped.

11. The polarization-doped enhancement mode HEMT device of claim 3, wherein a region of the cap layer and the second bather layer beneath the source is N-type doped.

* * * * *